United States Patent
Xia

(10) Patent No.: US 8,625,341 B2
(45) Date of Patent: *Jan. 7, 2014

(54) ARRAY STRUCTURAL DESIGN OF MAGNETORESISTIVE RANDOM ACCESS MEMORY (MRAM) BIT CELLS

(75) Inventor: William H. Xia, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/448,652

(22) Filed: Apr. 17, 2012

(65) Prior Publication Data

US 2013/0100732 A1    Apr. 25, 2013

Related U.S. Application Data

(63) Continuation of application No. 12/098,017, filed on Apr. 4, 2008, now Pat. No. 8,159,870.

(51) Int. Cl.
*G11C 11/14* (2006.01)

(52) U.S. Cl.
USPC ........... 365/171; 365/148; 365/158; 977/933; 977/935

(58) Field of Classification Search
USPC ......... 365/48, 55, 62, 66, 74, 78, 80–93, 100, 365/130, 131, 148, 158, 171–173, 225.5, 365/243.5; 216/22; 257/421, E21.665; 438/3; 977/933–935

See application file for complete search history.

(56) References Cited

U.S. PATENT DOCUMENTS

| 8,159,870 B2 | 4/2012 | Xia | |
|---|---|---|---|
| 2002/0172068 A1 | 11/2002 | Hidaka | |
| 2007/0206406 A1 | 9/2007 | Ueda et al. | |
| 2007/0279968 A1* | 12/2007 | Luo et al. | 365/158 |
| 2008/0219043 A1* | 9/2008 | Yoon et al. | 365/158 |
| 2008/0219044 A1* | 9/2008 | Yoon et al. | 365/158 |

FOREIGN PATENT DOCUMENTS

| CN | 1428785 A | 7/2003 |
|---|---|---|
| EP | 1321941 A1 | 6/2003 |
| EP | 1653475 A1 | 5/2006 |
| JP | 02117169 | 5/1990 |
| JP | 04125962 | 4/1992 |
| JP | 2003078114 A | 3/2003 |
| JP | 2003249073 A | 9/2003 |
| JP | 2007081161 A | 3/2007 |

(Continued)

OTHER PUBLICATIONS

Hosomi, M. et al.: "A novel nonvolatile memory with spin torque transfer magnetization switching: Spin-RAM," in IEEE International Electron Devices Meeting (IEDM) Technical Digest, Dec. 5, 2005, pp. 459-462.

(Continued)

*Primary Examiner* — Harry W Byrne
(74) *Attorney, Agent, or Firm* — Sam Talpalatsky; Nicholas J. Pauley; Joseph Agusta

(57) ABSTRACT

Spin Transfer Torque Magnetoresistive Random Access Memory (STT-MRAM) bit cells are disclosed. The bit cells include a source line formed in a first plane and a bit line formed in a second plane. The bit line has a longitudinal axis that is parallel to a longitudinal axis of the source line, and the source line overlaps at least a portion of the bit line.

34 Claims, 9 Drawing Sheets

(56) References Cited

FOREIGN PATENT DOCUMENTS

| | | | |
|---|---|---|---|
| JP | 2007235047 A | 9/2007 | |
| JP | 2007300079 A | 11/2007 | |
| KR | 20030009123 A | 1/2003 | |
| KR | 20030053051 A | 6/2003 | |
| RU | 2310928 C2 | 11/2007 | |
| WO | 9914760 | 3/1999 | |

OTHER PUBLICATIONS

International Search Report and Written Opinion—PCT/US2009/037935, International Searching Authority—European Patent Office, Sep. 9, 2009.

Taiwan Search Report—TW098109797—TIPO—Feb. 2, 2013.

\* cited by examiner

ARRAY STRUCTURAL DESIGN OF MAGNETORESISTIVE RANDOM ACCESS MEMORY (MRAM) BIT CELLS

CLAIM OF PRIORITY UNDER 35 U.S.C. §120

The present Application for Patent is a continuation of patent application Ser. No. 12/098,017 entitled "ARRAY STRUCTURAL DESIGN OF MAGNETORESISTIVE RANDOM ACCESS MEMORY (MRAM) BIT CELLS" filed Apr. 4, 2008, pending, and assigned to the assignee hereof and hereby expressly incorporated by reference herein in its entirety.

FIELD OF DISCLOSURE

Exemplary embodiments of the invention are directed to array structural designs of Magnetoresistive Random Access Memory (MRAM) bit cells. More particularly, embodiments of the invention are related to array structural designs of Spin Transfer Torque Magnetoresistive Random Access Memory (STT-MRAM).

BACKGROUND

Magnetoresistive Random Access Memory (MRAM) is a non-volatile memory technology that uses magnetic elements. For example, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM).

Referring to FIG. 1, a diagram of a conventional STT-MRAM cell 100 is illustrated. The STT-MRAM bit cell 100 includes magnetic tunnel junction (MTJ) storage element 105, transistor 110, bit line 120 and word line 130. The MTJ storage element is formed, for example, from a pinned layer and a free layer, each of which can hold a magnetic field, separated by an insulating (tunnel barrier) layer as illustrated in FIG. 1. The STT-MRAM bit cell 100 also includes a source line 140, sense amplifier 150, read/write circuitry 160 and bit line reference 170. Those skilled in the art will appreciate the operation and construction of the memory cell 100 is known in the art. Additional details are provided, for example, in M. Hosomi, et al., A Novel Nonvolatile Memory with Spin Transfer Torque Magnetoresistive Magnetization Switching: Spin-RAM, proceedings of IEDM conference (2005), which is incorporated herein by reference in its entirety.

Referring to FIG. 2, in conventional designs, the source lines (SL) of the magnetic tunnel junction (MTJ) bit cell arrays are arranged to be parallel to either the bit line (BL) or the word line. However, in conventional designs there is no direct and parallel overlap between the source line (SL) and bit line (BL) due to via and metal spacing rules. Therefore, the minimum bit cell size of conventional designs cannot be reduced or minimized as a result of metal and via spacing rules.

FIG. 3 is a top down screen view of a conventional magnetic tunnel junction (MTJ) bit cell array having source lines (SL) arranged parallel to the bit lines (BL). As shown in FIG. 3, the source lines (SL) do not overlap the bit lines (BL), and thus, the bit cell size is limited by the spacing rules between the source lines (SL) and the bit lines (BL).

SUMMARY

Exemplary embodiments of the invention are directed to array structural designs of Magnetoresistive Random Access Memory (MRAM) bit cells. More particularly, embodiments of the invention are related to array structural designs of Spin Transfer Torque Magnetoresistive Random Access Memory (STT-MRAM). Accordingly, an exemplary embodiment of the invention can include a Spin Transfer Torque Magnetoresistive Random Access Memory (STT-MRAM) bit cell including a source line formed in a first plane, and a bit line formed in a second plane and having a longitudinal axis that is parallel to a longitudinal axis of the source line, wherein the source line overlaps at least a portion of the bit line.

Another exemplary embodiment of the invention can include a Spin Transfer Torque Magnetoresistive Random Access Memory (STT-MRAM) bit cell including a first metal layer forming a bit line having a longitudinal axis in a first plane, and a second metal layer forming a source line having a longitudinal axis in a second plane, wherein the longitudinal axis of the first metal layer is parallel to the longitudinal axis of the second metal layer, and wherein the first metal layer overlaps at least a portion of the second metal layer.

Another exemplary embodiment of the invention can include a Spin Transfer Torque Magnetoresistive Random Access Memory (STT-MRAM) bit cell array including a plurality of bit cells. Each bit cell can include a source line formed in a first plane, and a bit line formed in a second plane and having a longitudinal axis that is parallel to a longitudinal axis of the source line, wherein the source line overlaps at least a portion of the bit line.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Embodiments of the invention can provide an MRAM bit cell array that may reduce the bit cell size. For example, an embodiment of an STT-MRAM bit cell array can reduce average bit cell size by placing at least a portion of the source line (SL) on top of the bit line (BL) so that it can overcome the limitations imposed by conventional metal and via interconnect spacing rules.

Embodiments can solve the problems of the conventional MRAM bit cell arrays. Embodiments can reduce the MTJ bit cell sizes by adding via interconnects to the source line (SL) and adding a top thin metal layer (e.g. M7) such that the source line (SL) is configured to be directly on top of or above (e.g., overlapping and parallel to) the bit line (BL) to overcome conventional main metal and via design rule limitations, thereby saving silicon space.

Figure 1:
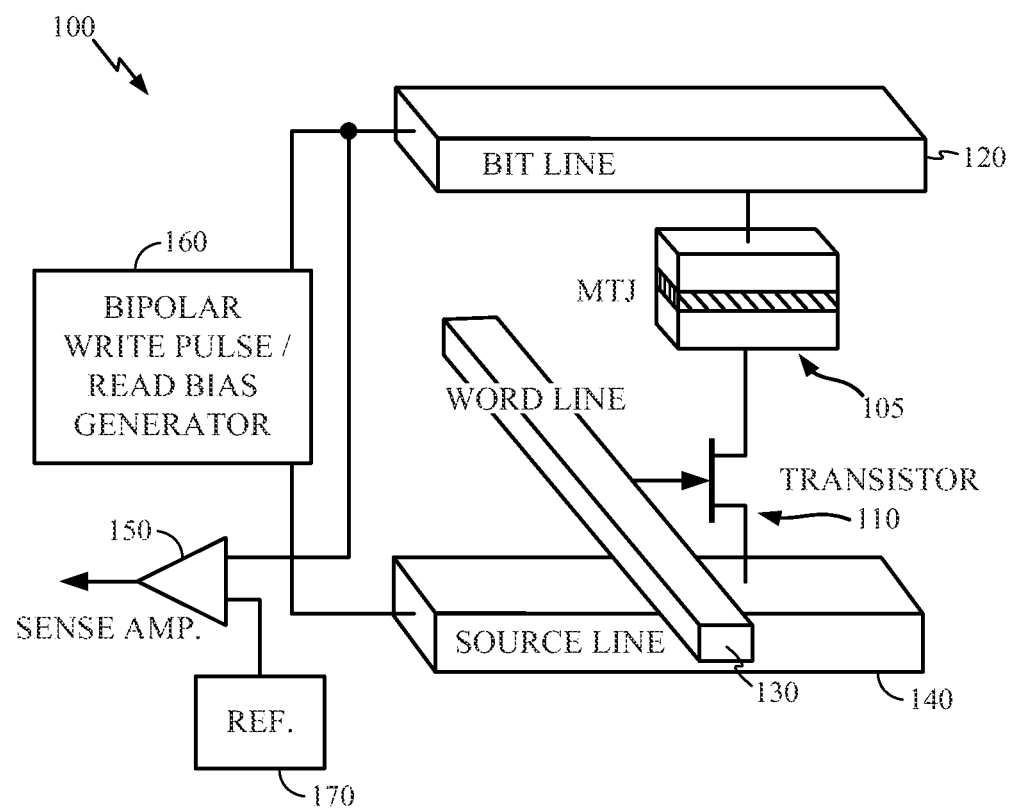
FIG. 1 illustrates a conventional Spin Transfer Torque Magnetoresistive Random Access Memory (STT-MRAM) cell.
Figure 2:
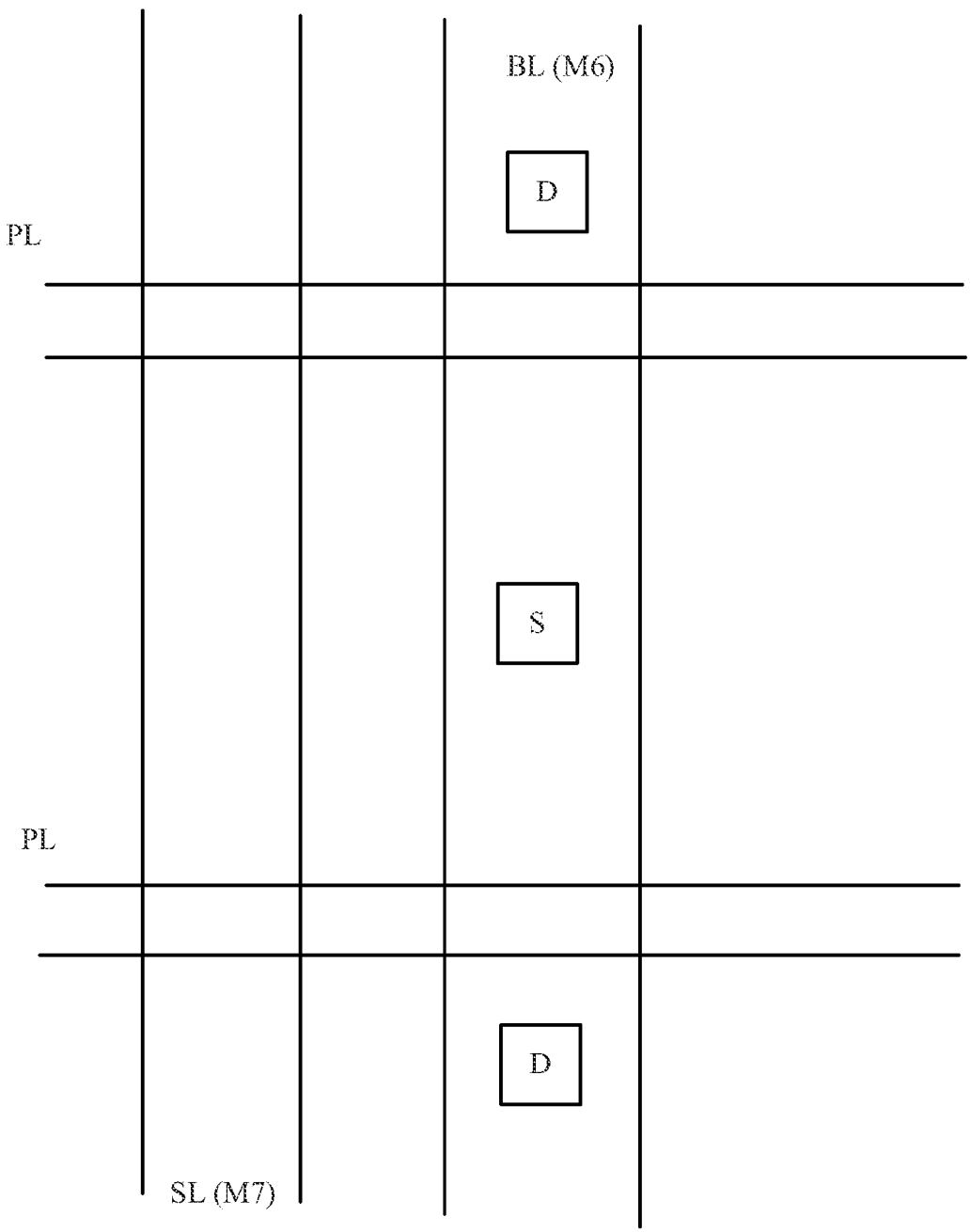
FIG. 2 is an illustration of a conventional MRAM bit cell array.
Figure 3:
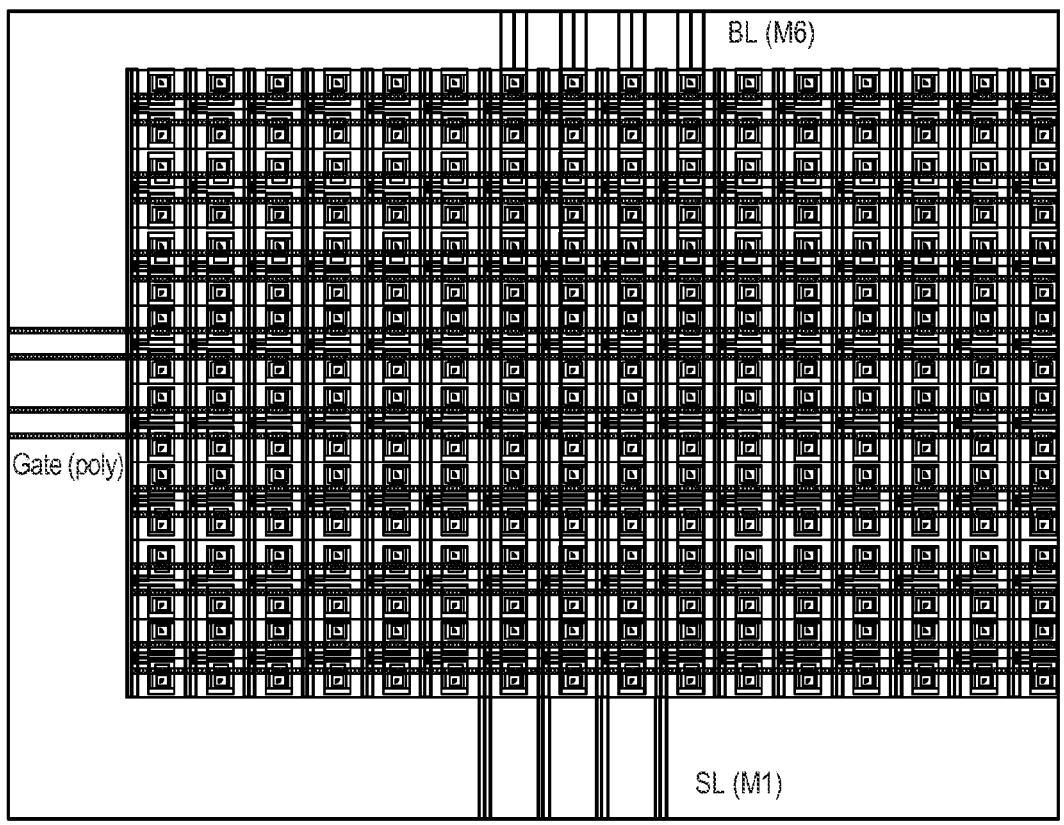
FIG. 3 is a top down screen view of a conventional MRAM bit cell array.
Figure 4:
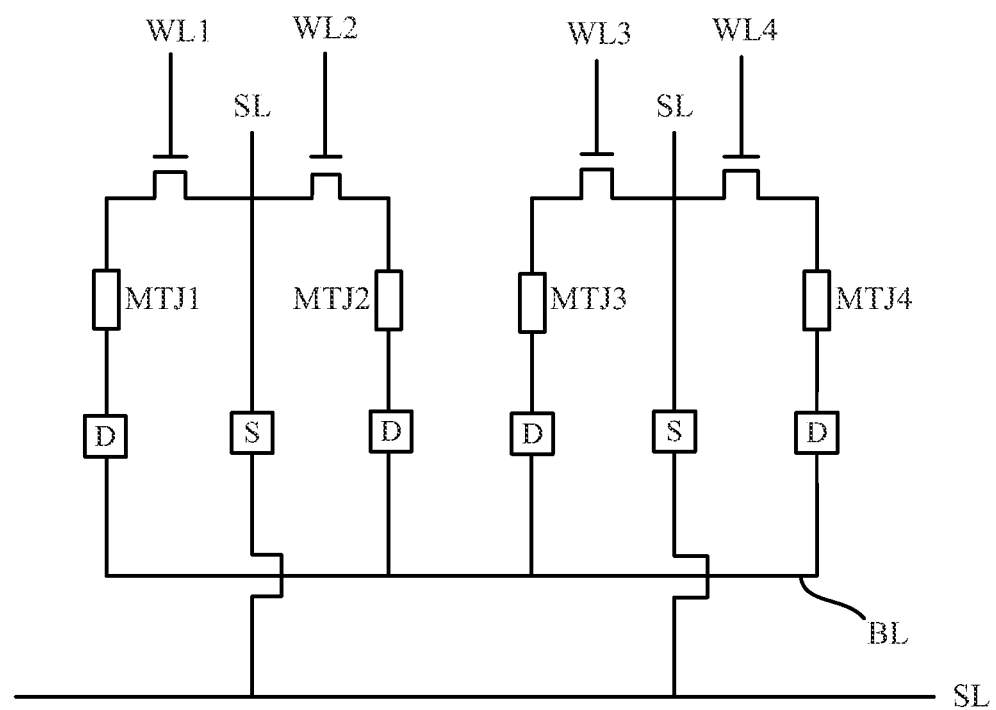
FIG. 4 is a schematic of an embodiment of an MRAM bit cell array.

Referring to FIGS. 4-10, embodiments of the invention can provide an MRAM bit cell array that reduces or minimizes the bit cell size. For example, FIG. 4 schematically illustrates an embodiment of an MRAM bit cell array. An embodiment of the STT-MRAM bit cell array can reduce average bit cell size by placing the source line (SL) overlapping and parallel to (e.g., above) the bit line (BL) to resolve or overcome limitations resulting from conventional metal and via interconnect spacing rules.

Figure 5:
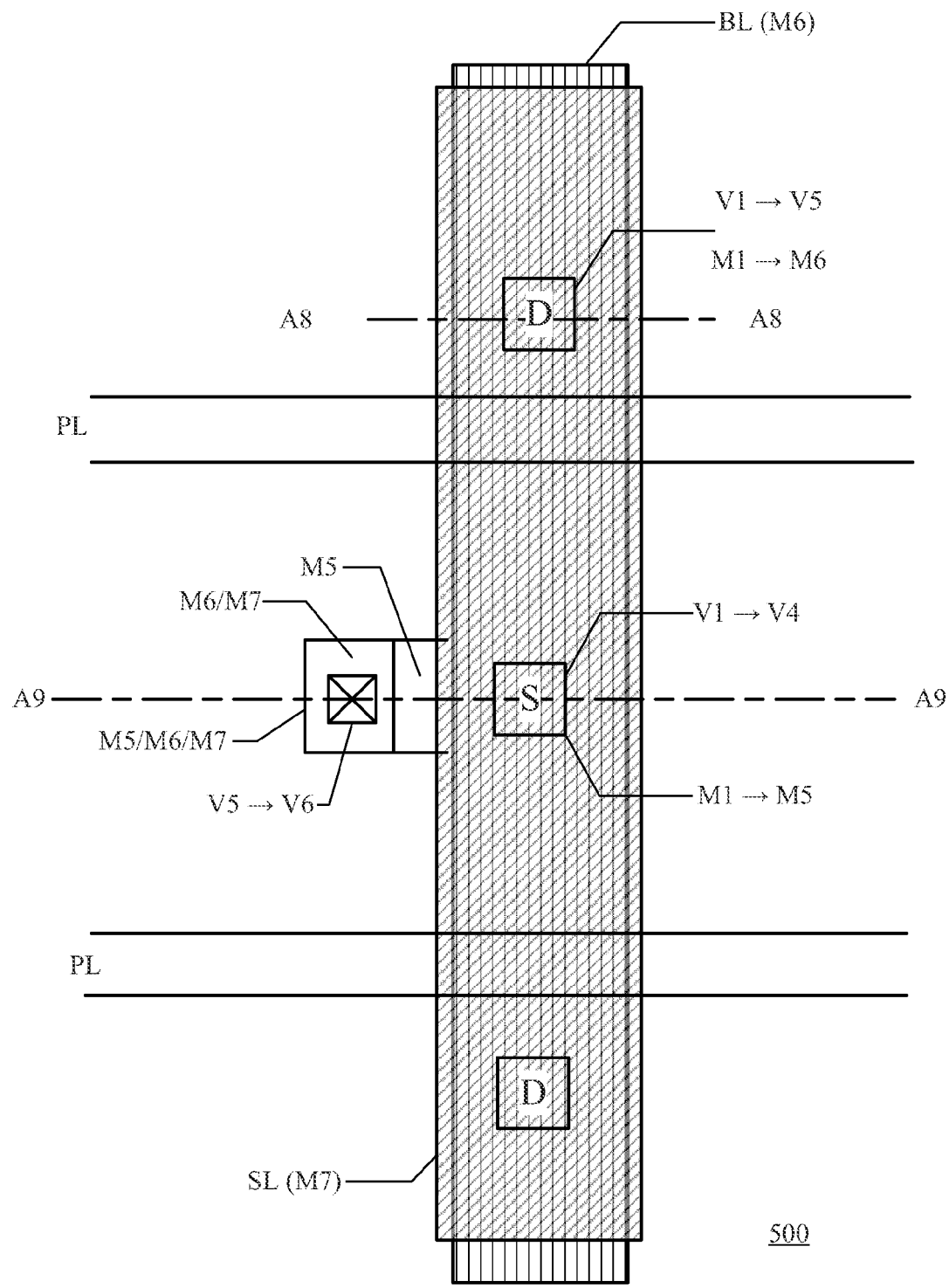
FIG. 5 is a top down illustration of an embodiment of an MRAM bit cell array.

As shown in FIG. 5, an exemplary STT-MRAM bit cell 500 includes a source line (SL) formed in a first plane and a bit line (BL) formed in a second plane. The bit line (BL) has a longitudinal axis that is parallel to a longitudinal axis of the source line (SL). According to the exemplary embodiments, the source line (SL) overlaps at least a portion of the width of the bit line (BL), thereby reducing the bit cell size. In one embodiment, the source line (SL) can substantially overlap the width of the bit line (BL), thereby further reducing the bit cell size. As another example, as shown in the exemplary embodiment of FIG. 5, the source line (SL) can completely overlap the bit line (BL), thereby further reducing the bit cell size.

In the exemplary embodiment illustrated in FIG. 5, the MTJ bit cell size is reduced by adding a top thin metal layer (M7) to form the source line (SL) directly on top of or above (e.g., overlapping and parallel to) the bit line (BL). The metal layers M5 and M7 are extended in a direction perpendicular to the longitudinal axis of the source line (SL) and the bit line (BL) and in the same plane as the respective metal layers M5 and M7 such that at least a portion of the metal layers M5 and M7 are not overlapping with the bit line (BL). A via interconnect connects (e.g., electrically connects) the portions of the metal layers M5 and M7, which are not overlapping with the bit line (BL), to each other.

For example, in an embodiment, a portion of the metal layers M5 and M7 are extended in a direction perpendicular to the longitudinal axis of the source line (SL) and the bit line (BL) and in the same plane as the respective metal layers M5 and M7 to form lateral extensions (e.g., first and second lateral extensions). A via interconnect connects (e.g., electrically connects) the lateral extensions to each other.

In an embodiment, a metal layer M6 is formed in the area of the lateral extensions between metal layers M5 and M7. The illustrative embodiment shown in FIG. 5 includes a via interconnect V5 to connect the lateral extension of metal layer M5 to the metal layer M6 and a via interconnect V6 to connect the metal layer M6 to the lateral extension of metal layer M7. Thus, the embodiment can avoid shorting or interconnect of the source line (e.g., M7) to the bit line (BL) which would otherwise result from the parallel overlapping of the source line (SL) and the bit line (BL). Cross-sectional illustrations of the embodiment of the MRAM bit cell array of FIG. 5 are described below with reference to FIGS. 8 and 9.

In another exemplary embodiment, the MTJ cell can be moved one metal layer down such that the existing top thin metal (e.g., M6) can be used as the source line (SL). Accordingly, in this illustrative embodiment, an additional metal layer (e.g., M7) is not included in the bit cell.

Figure 6:
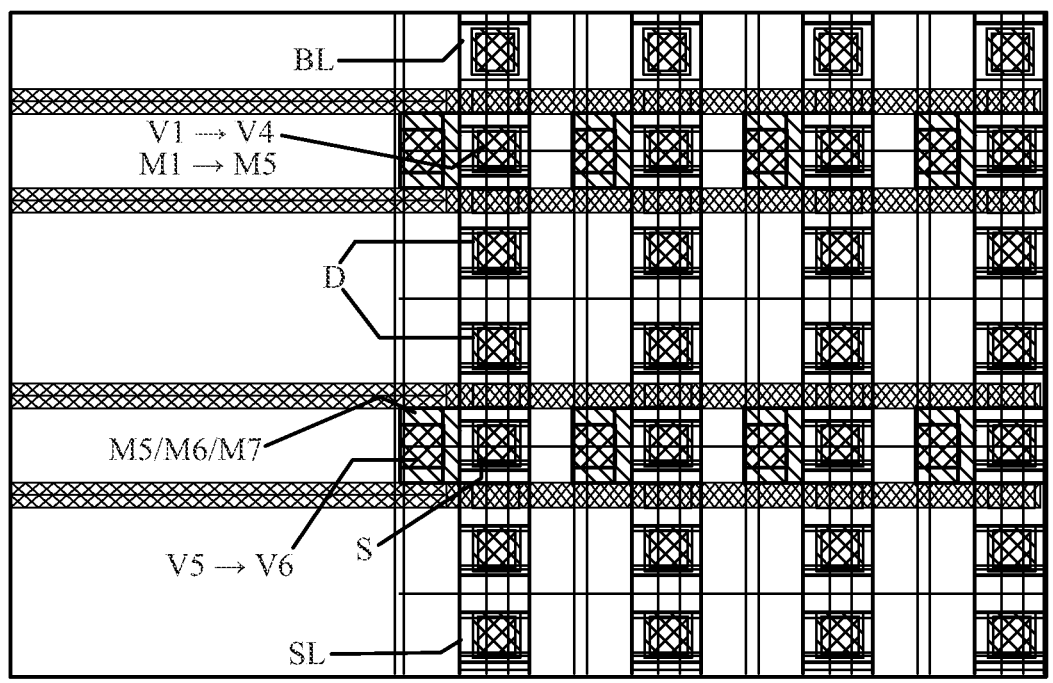
FIG. 6 is a top down screen view of an embodiment of an MRAM bit cell array.
Figure 7:
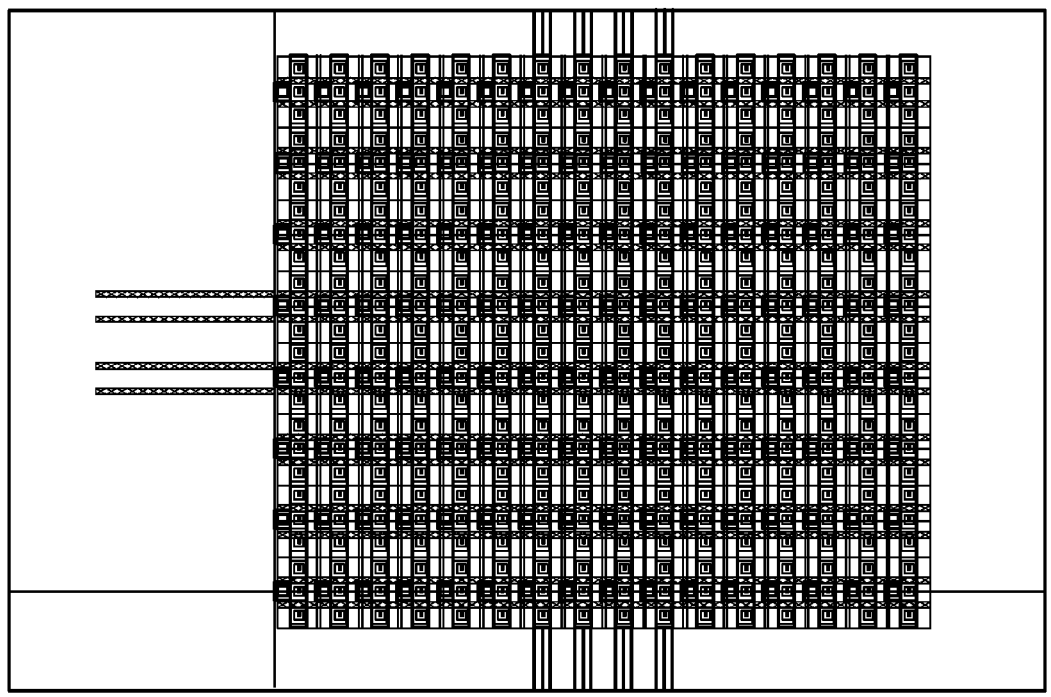
FIG. 7 is another top down screen view of an embodiment of an MRAM bit cell array.

FIG. 6 is a top down screen view of an embodiment of an MRAM bit cell array 600, generally corresponding to the embodiment illustrated in FIG. 5, with like elements being labeled the same. FIG. 7 is another top down screen view of an embodiment of an MRAM bit cell array 700 illustrating a larger scale integration of the bit cells.

Figure 8:
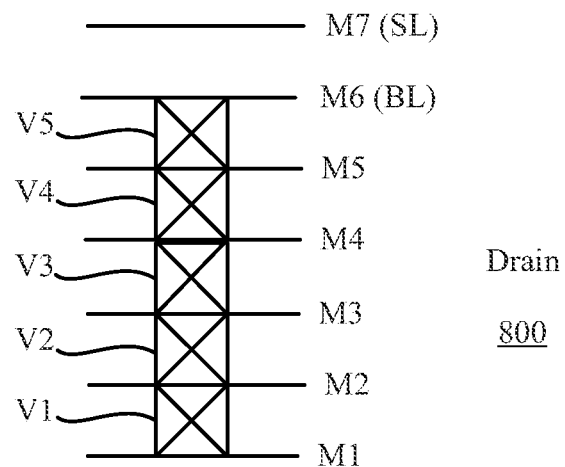
FIG. 8 is a cross-sectional illustration of the embodiment of the MRAM bit cell array of FIG. 5 along A8-A8.

FIG. 8 is a cross-section illustration of the embodiment of a drain 800 of the MRAM bit cell array of FIG. 5 along A8-A8. As shown in FIG. 8, the metal layers M1, M2, M3, M4, M5, and M6 (BL) are connected to each other by via interconnects V1, V2, V3, V4, and V5, respectively. The source line M7 is configured to be parallel to and overlapping with the metal layer M6 (BL) but not interconnected.

Figure 9:
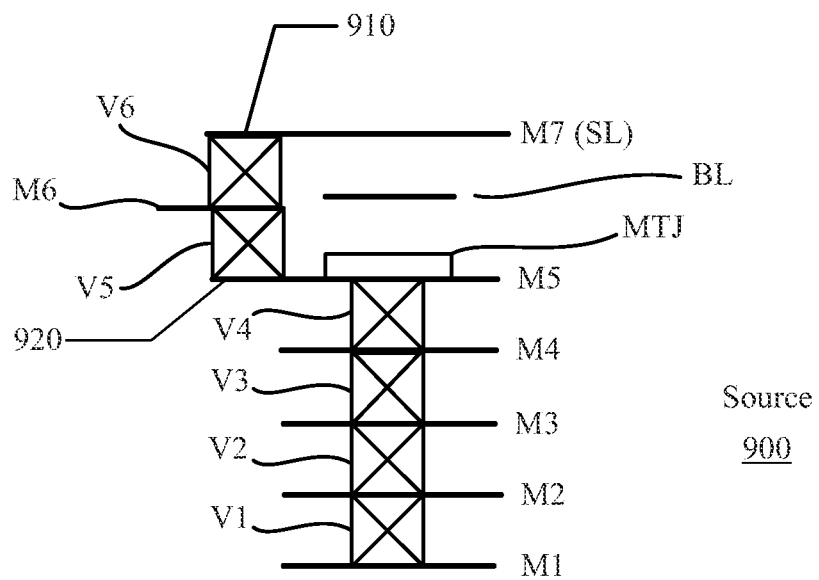
FIG. 9 is a cross-sectional illustration of the embodiment of the MRAM bit cell array of FIG. 5 along A9-A9.

FIG. 9 is a cross-sectional illustration of the embodiment of a source 900 of the MRAM bit cell array of FIG. 5 along A9-A9. As shown in FIG. 9, the metal layers M1, M2, M3, M4, and M5 are connected to each other by via interconnects V1, V2, V3, and V4, respectively. The metal layers M5 and M7 extend in a direction perpendicular to the longitudinal axis of the source line (SL) and the bit line (BL) and in the same plane as the respective metal layers M5 and M7 to form lateral extensions (e.g., first later extension 910 and second lateral extension 920). A metal layer (e.g., M6 in FIG. 9) is formed in the area of the lateral extensions between metal layers M5 and M7. For example, as shown in the embodiment of FIG. 9, the metal layer (e.g., M6) can be formed in the same plane as the bit line (BL), but electrically isolated from the bit line (BL). The embodiment includes via interconnects V5 and V6 to connect the lateral extension 920 of metal layer M5 to the metal layer M6 and the metal layer M6 to the lateral extension 910 of metal layer M7, respectively.

Figure 10:
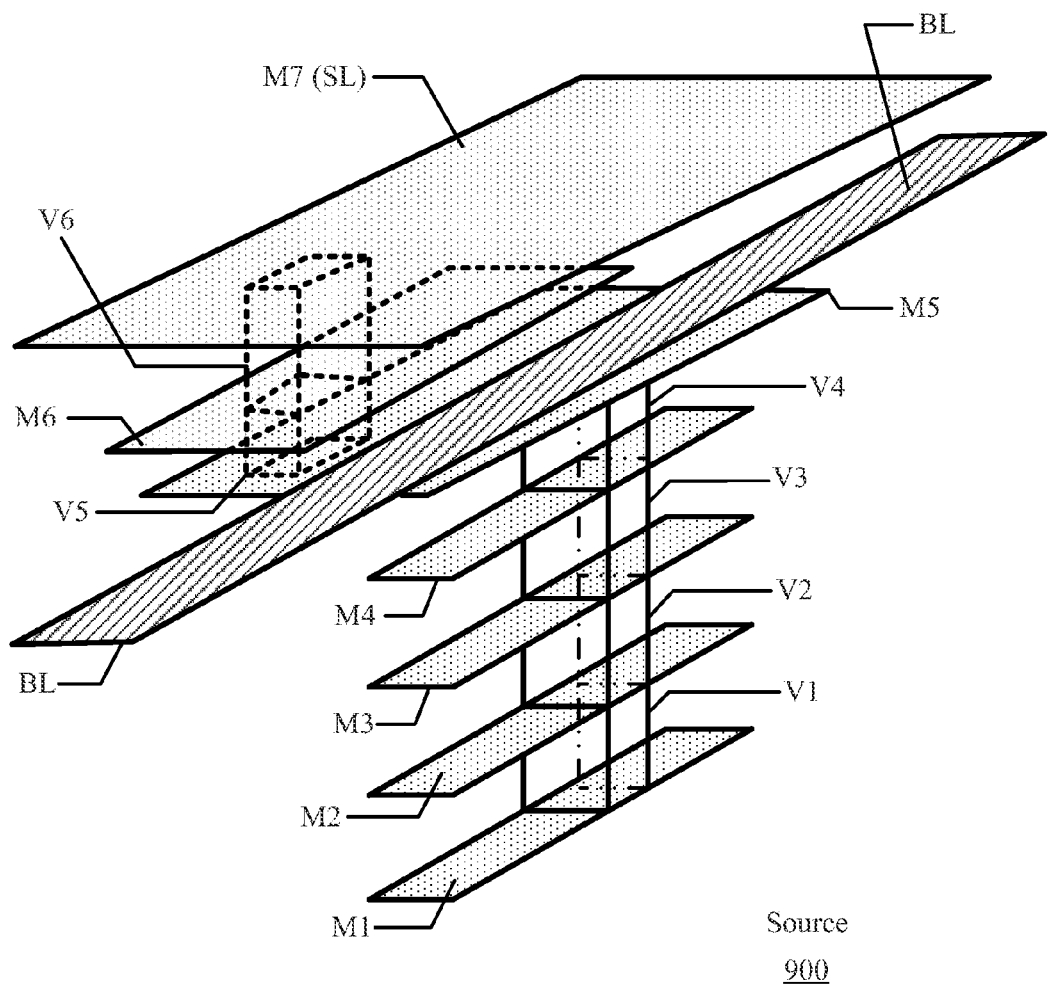
FIG. 10 is a perspective illustration of an embodiment of an RAM bit cell array.

As shown in FIG. 10, which is a perspective illustration of an embodiment of a source 900 of an MRAM bit cell array, the source line (SL) (e.g., M7) is configured to be parallel to and overlapping with the bit line (BL) but not interconnected (e.g., not electrically interconnected). Thus, the exemplary embodiments can avoid shorting the source line (SL) M7) to the bit line (BL) which would otherwise result from the parallel overlapping of the source line (SL) and the bit line (BL), while minimizing or reducing the average bit cell size compared with the conventional bit cell design.

According to an embodiment, one or more via interconnects (e.g., V5 and V6) and a top thin metal layer (M7) can be designed to connect the source line (SL) of the access transistor in a MTJ bit cell so that the source line (SL) can be placed directly on top of or above (e.g., overlapping and parallel to) the bit line (BL) without shorting or interconnecting of the source line (SL) (e.g., M7) to the bit line (BL), thereby reducing the average bit cell area.

Accordingly, an embodiment of the invention can be a Spin Transfer Torque Magnetoresistive Random Access Memory (STT-MRAM) bit cell including a source line (SL) formed in a first plane, and a bit line (BL) formed in a second plane and having a longitudinal axis that is parallel to a longitudinal axis of the source line (SL), wherein the source line (SL) overlaps at least a portion of the bit line (BL). In an embodiment, the source line (SL) can substantially overlap the bit line (BL).

In an embodiment, the source line (SL) includes a first lateral extension 910 that extends in the first plane and in a direction perpendicular to the longitudinal axis of the source line (SL) such that a portion of the first lateral extension 910 is not overlapping with the bit line (BL).

In another embodiment, the source line is a first metal layer (e.g., M7 (SL)) and the bit line is a second metal layer (e.g., BL). The bit cell also can include a third metal layer (e.g., M5) formed in a third plane and having a longitudinal axis that is parallel to the longitudinal axis of the first metal layer (e.g., M7), wherein the second metal layer (e.g., BL) interposes the first metal layer (e.g., M7) and the third metal layer (e.g., M5). The first metal layer (e.g., M7) and/or the second metal layer (e.g., BL) can overlap at least a portion of the third metal layer (e.g., M5).

The third metal layer (e.g., M5) can include a second lateral extension 920 that extends in the third plane and in a direction perpendicular to the longitudinal axis of the third metal layer (e.g., M5). The first lateral extension 910 can overlap the second lateral extension 920 and can be electrically connected to the second lateral extension 920.

In an embodiment, at least one via interconnect (e.g., V5, V6, etc.) connects the first lateral extension 910 to the second lateral extension 920. In another embodiment, a fourth metal layer (e.g., M6) interposes the first lateral extension 910 and the second lateral extension 920. A first via interconnect (e.g., V6) connects the first lateral extension 910 to the fourth metal layer (e.g., M6), and a second via interconnect (e.g., V5) connects the fourth metal layer (e.g., M6) to the second lateral extension 920. In an embodiment, the fourth metal layer (e.g., M6) is formed in the second plane and can be electrically isolated from the second metal layer (e.g., BL).

In other embodiments, the STT-MRAM bit cell can include a word line, a storage element, and a word line transistor coupled to the storage element. The storage element can be a magnetic tunnel junction (MTJ), as illustrated for example in FIG. 9, and the word line transistor can be coupled in series with the MTJ.

In another embodiment, a Spin Transfer Torque Magnetoresistive Random Access Memory (STT-MRAM) bit cell can include a first metal layer (e.g., M7) forming a source line having a longitudinal axis in a first plane, and a second metal layer (e.g., BL) forming a bit line having a longitudinal axis in a second plane, wherein the longitudinal axis of the first metal layer (e.g., M7) is parallel to the longitudinal axis of the second metal layer (e.g., BL), and wherein the first metal layer (e.g., M7) overlaps at least a portion of the second metal layer (e.g., BL).

In another embodiment, a Spin Transfer Torque Magnetoresistive Random Access Memory (STT-MRAM) bit cell array includes a plurality of bit cells. Each bit cell includes a source line formed in a first plane, and a bit line formed in a second plane and having a longitudinal axis that is parallel to a longitudinal axis of the source line, wherein the source line overlaps (e.g., on top or below) at least a portion of the bit line. The exemplary embodiments of an STT-MRAM bit cell array can reduce average bit cell size by placing the source line (SL) overlapping and generally parallel to the bit line (BL) to reduce the area used in conventional metal and via interconnect configurations. Embodiments of the MRAM bit cell arrays and can reduce the bit cell sizes by adding via interconnects to the source line (SL) and adding a top thin metal layer (e.g., M7) such that the source line (SL) is configured to be directly on top of or above the bit line (BL) to overcome conventional main metal and via design rule limitations, thereby saving space.

While the foregoing disclosure shows illustrative embodiments of the invention, it should be noted that various changes and modifications could be made herein without departing from the scope of the invention as defined, by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A Spin Transfer Torque Magnetoresistive Random Access Memory (STT-MRAM) bit cell comprising:
   a first means for conducting formed in a first plane; and
   a second means for conducting formed in a second plane and having a longitudinal axis that is parallel to a longitudinal axis of the first means for conducting,
   wherein the first means for conducting overlaps at least a portion of the second means for conducting.

2. The STT-MRAM bit cell of claim 1, wherein the first means for conducting includes a first lateral extension that extends in the first plane and in a direction perpendicular to the longitudinal axis of the first means for conducting such that a portion of the first lateral extension is not overlapping with the second means for conducting.

3. The STT-MRAM bit cell of claim 2, wherein the first means for conducting is a first metal layer and the second means for conducting is a second metal layer,
   the bit cell further comprising:
      a third metal layer formed in a third plane and having a longitudinal axis that is parallel to the longitudinal axis of the first metal layer,
      wherein the second metal layer interposes the first metal layer and the third metal layer.

4. The STT-MRAM bit cell of claim 3, wherein the first metal layer and/or the second metal layer overlap at least a portion of the third metal layer.

5. The STT-MRAM bit cell of claim 3, wherein the third metal layer includes a second lateral extension that extends in the third plane and in a direction perpendicular to the longitudinal axis of the third metal layer, and
   wherein the first lateral extension overlaps the second lateral extension and is electrically connected to the second lateral extension.

6. The STT-MRAM bit cell of claim 5, further comprising:
   at least one means for interconnecting that connects the first lateral extension to the second lateral extension.

7. The STT-MRAM bit cell of claim 5, further comprising:
   a fourth metal layer interposing the first lateral extension and the second lateral extension;
   a first means for interconnecting that connects the first lateral extension to the fourth metal layer; and
   a second means for interconnecting that connects the fourth metal layer to the second lateral extension.

8. The STT-MRAM bit cell of claim 7, wherein the fourth metal layer is formed in the second plane and is electrically isolated from the second metal layer.

9. The STT-MRAM bit cell of claim 1, wherein the first means for conducting substantially overlaps the second means for conducting.

10. The STT-MRAM bit ell of claim 1, further comprising:
a word line;
a means for storage; and
a word line transistor coupled to the means for storage.

11. The STT-MRAM bit cell of claim 10, wherein the means for storage is a magnetic tunnel junction (MTJ) and wherein the word line transistor is coupled in series with the MTJ.

12. A Spin Transfer Torque Magnetoresistive Random Access Memory (STT-MRAM) bit cell comprising:
a first metal layer forming a first means for conducting having a longitudinal axis in a first plane; and
a second metal layer forming a second means for conducting having a longitudinal axis in a second plane,
wherein the longitudinal axis of the first metal layer is parallel to the longitudinal axis of the second metal layer, and
wherein the first metal layer overlaps at least a portion of the second metal layer.

13. The STT-MRAM bit cell of claim 12, wherein the first metal layer includes a first lateral extension that extends in a direction perpendicular to the longitudinal axis of the first metal layer such that a portion of the first lateral extension is not overlapping with the second metal layer.

14. The STT-MRAM bit cell of claim 13, further comprising:
a third metal layer formed in a third plane and having a longitudinal axis that is parallel to the longitudinal axis of the first metal layer,
wherein the second metal layer interposes the first metal layer and the third metal layer.

15. The STT-MRAM bit cell of claim 14, wherein the first metal layer and/or the second metal layer overlap at least a portion of the third metal layer.

16. The STT-MRAM bit cell of claim 14, wherein the third metal layer includes a second lateral extension that extends in a direction perpendicular to the longitudinal axis of the third metal layer, and
wherein the first lateral extension overlaps the second lateral extension and is electrically connected to the second lateral extension.

17. The STT-MRAM bit cell of claim 16, further comprising:
at least one means for interconnecting that connects the first lateral extension to the second lateral extension.

18. The STT-MRAM bit cell of claim 16, further comprising:
a fourth metal layer interposing the first lateral extension and the second lateral extension;
a first means for interconnecting that connects the first lateral extension to the fourth metal layer; and
a second means for interconnecting that connects the fourth metal layer to the second lateral extension.

19. The STT-MRAM bit cell of claim 18, wherein the fourth metal layer is formed in the second plane and is electrically isolated from the second metal layer.

20. The STT-MRAM bit cell of claim 12, wherein the first metal layer substantially overlaps the second metal layer.

21. The STT-MRAM bit cell of claim 12, further comprising:
a word line;
a means for storing; and
a word line transistor coupled to the means for storing.

22. The STT-MRAM bit cell of claim 21, wherein the means for storing is a magnetic tunnel junction (MTJ) and wherein the word line transistor is coupled in series with the MTJ.

23. A Spin Transfer Torque Magnetoresistive Random Access Memory (STT-MRAM) bit cell array comprising:
a plurality of bit cells, each bit cell including:
a first means for conducting formed in a first plane; and
a second means for conducting formed in a second plane and having a longitudinal axis that is parallel to a longitudinal axis of the first means for conducting,
wherein the first means for conducting overlaps at least a portion of the second means for conducting.

24. A method for forming a Spin Transfer Torque Magnetoresistive Random Access Memory (STT-MRAM) bit cell comprising:
forming a source line in a first plane; and
forming a bit line in a second plane and having a longitudinal axis that is parallel to a longitudinal axis of the source line,
wherein the source line overlaps at least a portion of the bit line.

25. The method of claim 24, wherein forming the source line comprises:
forming a first lateral extension that extends in the first plane and in a direction perpendicular to the longitudinal axis of the source line such that a portion of the first lateral extension is not overlapping with the bit line.

26. The method of claim 25, wherein the source line is a first metal layer and the bit line is a second metal layer, further comprising:
forming a third metal layer in a third plane and having a longitudinal axis that is parallel to the longitudinal axis of the first metal layer,
wherein the second metal layer interposes the first metal layer and the third metal layer.

27. The method of claim 26, wherein the first metal layer and/or the second metal layer overlap at least a portion of the third metal layer.

28. The method of claim 26, wherein the third metal layer includes a second lateral extension that extends in the third plane and in a direction perpendicular to the longitudinal axis of the third metal layer, and
wherein the first lateral extension overlaps the second lateral extension and is electrically connected to the second lateral extension.

29. The method of claim 28, further comprising:
providing at least one via interconnect that connects the first lateral extension to the second lateral extension.

30. The method of claim 28, further comprising:
providing a fourth metal layer interposing the first lateral extension and the second lateral extension;
providing a first via interconnect that connects the first lateral extension to the fourth metal layer; and
providing a second via interconnect that connects the fourth metal layer to the second lateral extension.

31. The method of claim 30, wherein the fourth metal layer is formed in the second plane and is electrically isolated from the second metal layer.

32. The method of claim 24, wherein the source line substantially overlaps the bit line.

33. The method of claim 24, further comprising:
   forming a word line;
   forming a storage element;
   forming a word line transistor; and
   coupling the word line to the word line transistor and the word line transistor to the storage element.

34. The method of claim 33, wherein the storage element is a magnetic tunnel junction (MTJ) and wherein the word line transistor is coupled in series with the MTJ.

* * * * *